Figure 1:
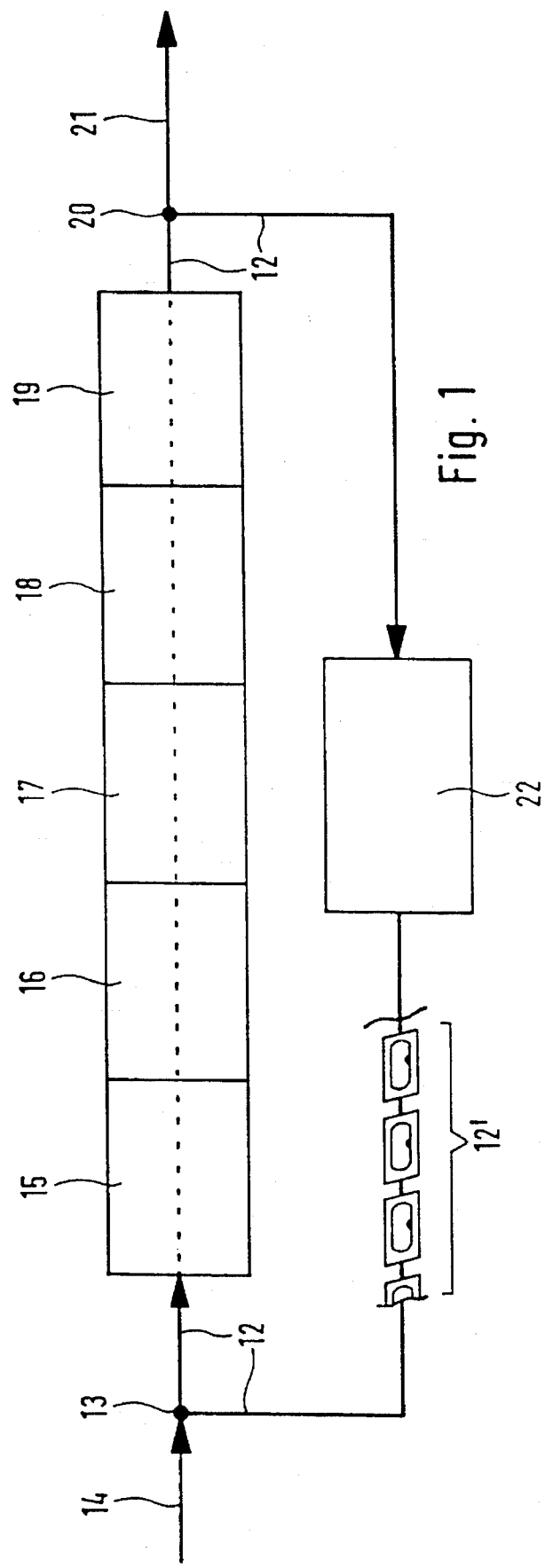

United States Patent [19]

Schneider et al.

[11] Patent Number: 5,520,741
[45] Date of Patent: May 28, 1996

[54] APPARATUS FOR PRODUCING A PLASMA POLYMER PROTECTIVE LAYER ON WORKPIECES, IN PARTICULAR HEADLAMP REFLECTORS

[75] Inventors: Guenter Schneider, Besigheim; Gerhard Benz, Böblingen; Juergen Hahn, Dettingen, all of Germany

[73] Assignee: Robert Bosch GmbH, Stuttgart, Germany

[21] Appl. No.: 318,769
[22] PCT Filed: Mar. 17, 1994
[86] PCT No.: PCT/DE94/00286
    § 371 Date: Oct. 14, 1994
    § 102(e) Date: Oct. 14, 1994
[87] PCT Pub. No.: WO94/23088
    PCT Pub. Date: Oct. 13, 1994

[30] Foreign Application Priority Data

Mar. 30, 1993 [DE] Germany ................. 43 10 258.1

[51] Int. Cl.⁶ ................................. C23C 16/00
[52] U.S. Cl. ................... 118/723 MW; 118/723 MR; 118/723 MA; 118/719; 118/729; 118/728
[58] Field of Search ..................... 118/723 MW, 118/723 MR, 723 MA, 719, 728, 729; 204/298.25, 298.16, 298.17, 298.18, 298.19, 298.2, 298.38, 298.37, 298.35

[56] References Cited

U.S. PATENT DOCUMENTS 4,842,707  6/1989  Kinoshita ................. 204/298
4,902,934  2/1990  Miyamura ............... 315/11121
5,021,114  6/1991  Saito ........................ 156/345
5,308,417  5/1994  Groechel .................. 156/643
5,378,284  1/1995  Geisler ................ 118/723 MR
5,425,611  6/1995  Huges .................... 414/217

FOREIGN PATENT DOCUMENTS 284436    9/1988  European Pat. Off. ..
430079    6/1991  European Pat. Off. ..
2625448  11/1986  Germany .
64000271  5/1989  Japan .
91/12353  8/1991  WIPO .

Primary Examiner—R. Bruce Breneman
Assistant Examiner—Joni Y. Chang
Attorney, Agent, or Firm—Spencer & Frank

[57] ABSTRACT

An apparatus is proposed for producing a plasma polymer protective layer on workpieces, in particular headlamp reflectors (10), which has a coating chamber (18) into which a polymerizable monomer can be introduced and in which microwaves produce, in the region of the magnetic field of permanent magnets, a plasma for depositing the polymer protective layer on the workpieces held on the workpiece carriers (11). The permanent magnets are arranged on the workpiece carriers (11). Furthermore, there is provided a transport device (12) which conveys the workpiece carriers (11) through the coating chamber (18), which transport device possesses a return line, having a cleaning station (22), for the workpiece carriers (11) outside the coating chamber (18) for returning the workpiece carriers (11) from the exit to the entrance of the coating chamber. By this means, the known ECR coating process can, with continuous cleaning of the magnets, be used in an in-line process.

11 Claims, 2 Drawing Sheets

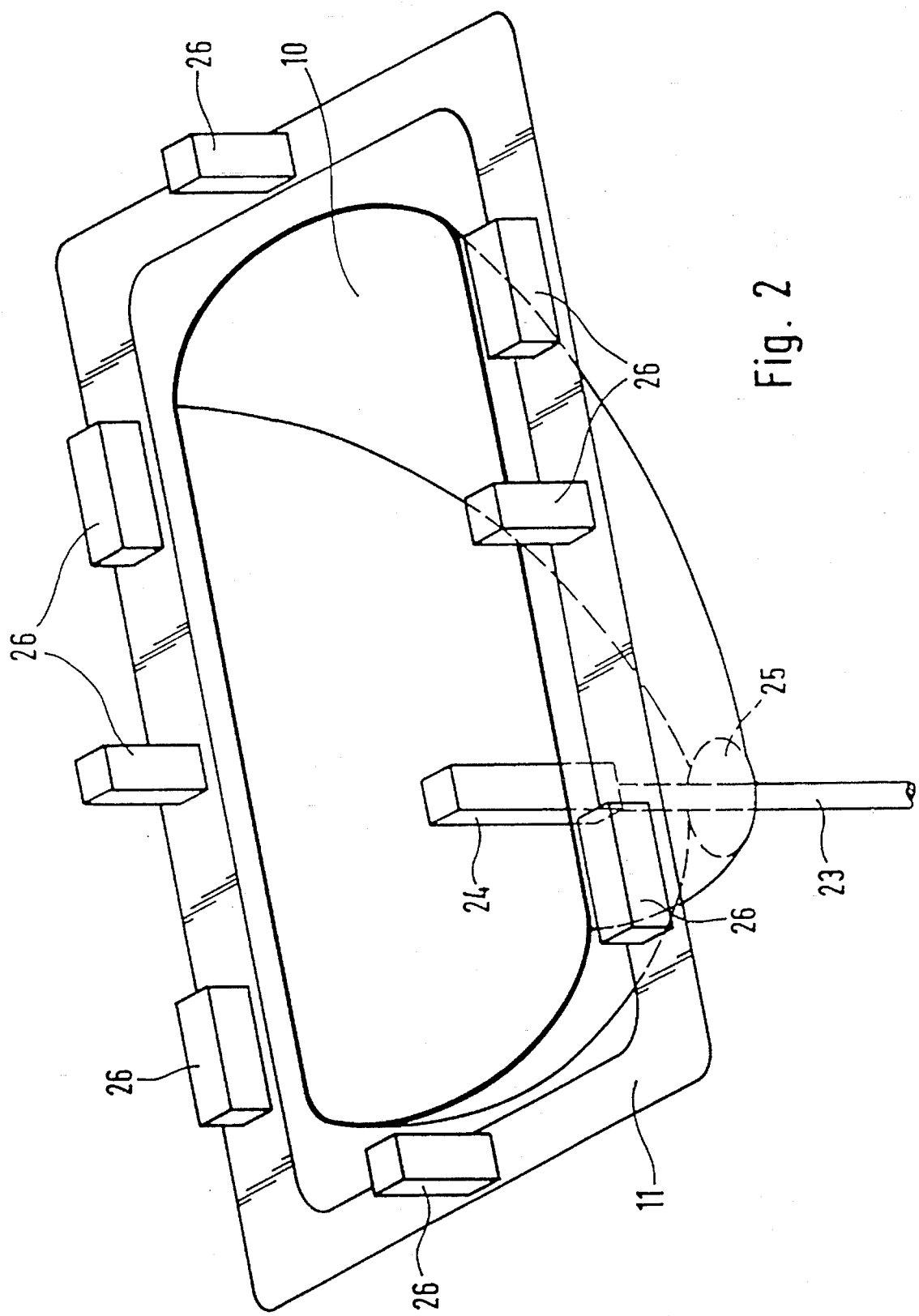

5,520,741

APPARATUS FOR PRODUCING A PLASMA POLYMER PROTECTIVE LAYER ON WORKPIECES, IN PARTICULAR HEADLAMP REFLECTORS

PRIOR ART

The invention relates to an apparatus for producing a plasma polymer protective layer on workpieces, in particular headlamp reflectors, of the generic type of the main claim.

To protect the reflective layer, generally comprising very bright aluminium, on headlamp reflectors against corrosion, a corrosion-protection layer has to be applied over the aluminium layer. To produce such a corrosion-protection layer for headlamp reflectors, the plasma polymerization process has become generally established. An early process variant known from DE-C 26 25 448 depends on a non-self-maintained glow discharge for generating the plasma required for activation of a monomer to be polymerized. A newer process known from DE-A 40 03 904 for producing such a protective layer depends on plasma generation in the microwave region by electron cyclotron resonance (ECR). When the ECR condition is met, a plasma is ignited in the magnetic field of a magnet bank comprising permanent magnets. If a polymerizable monomer, such as hexamethyldisiloxane, is introduced into the coating chamber, a glow-polymer protective layer can thereby be deposited. This is described in more detail in the cited document.

Both processes are nowadays employed industrially in a batch process, i.e. the production flow in the production of a headlamp is interrupted, and several hundred manually charged reflectors are provided in a coating chamber with the corrosion-protection layer and are then manually returned to the production flow. A problem in both processes is that the coating source is not completely maintenance-free: with the non-self-maintained glow discharge as in the earlier process, the tungsten glow emitters used have to be replaced after a few batches. In the more recent ECR method, the magnets required by the process are likewise coated and therefore, to avoid uncontrolled flake formation, have to be brushed from time to time. However, this means that these processes cannot easily be built into an in-line process. The coating chamber always has to remain under vacuum, and the reflectors are transferred in and out via locks. A maintenance step, for example for cleaning the magnets, would make it necessary to open the coating chamber to the air and therefore mean a halt in production.

ADVANTAGES OF THE INVENTION

The apparatus of the invention having the characterizing features of the main claim has the advantage in comparison with the above that the known ECR coating process can be used in an in-line process without it being necessary to stop production for the purpose of cleaning work. Since the magnets are arranged on the workpiece carriers, these can, by means of vacuum locks, be conveyed through the evacuated coating chamber and conveyed back again outside this chamber. A cleaning chamber can then be arranged without difficulty in the return section outside the coating chamber, in particular to free the magnets of coating material. The coating process can therefore proceed continuously, with the cleaning of the workpiece carriers and thereby the magnets also being carried out continuously.

The measures indicated in the subclaims make possible advantageous embodiments and improvements of the apparatus specified in the main claim.

The transport facility advantageously has a feed velocity corresponding to the production rhythm for the workpieces so that this apparatus can easily be built into an existing production line.

The plasma polymer coating chamber is arranged between vacuum inlet locks and outlet locks. The coating chamber can here preferably be preceded by a metallization chamber and this be preceded by a pre-glow chamber, so that the reflective metal coating can also be produced on the reflector during the same pass shortly before application of the corrosion-protection layer.

To give a high deposition rate and a good constancy of thickness for the protective layer on the optically effective surfaces, the permanent magnets on the workpiece carriers reach into the headlamp reflectors arranged thereon, preferably through the lamp openings. An advantageous structural embodiment here comprises the headlamp reflectors being set into correspondingly configured recesses of the workpiece carrier with the reflector opening facing upwards, with in each case at least one of the permanent magnets reaching from below through the lamp opening into the interior of the headlamp reflector. For this purpose, this permanent magnet is advantageously fitted to a holding rod. This ensures that the metallic coating process for the reflective layer upstream of the protective coating process is not hindered, i.e. that no shadowing of individual zones on the reflector occurs.

The thickness distribution of the layers can be influenced in a targeted way by means of further magnets on the periphery of the reflector, e.g. the layer thickness can be increased in the marginal region in the case of plane faces.

Suitable cleaning devices for the cleaning station are, in particular, rotating brushes and/or a compressed air cleaning device.

DIAGRAM

An example of the invention is shown in the diagram and is described in more detail below. In the diagram:

FIG. 1 schematically shows the coating and cleaning device and

FIG. 2 shows a headlamp reflector set into a workpiece carrier.

DESCRIPTION OF THE EXAMPLE

In accordance with the example schematically shown in FIG. 1, headlamp reflectors 10 are, for the purpose of being coated, arranged on workpiece carriers 11 which move along a closed track 12. Workpiece carriers 11 loaded in this way are shown, likewise schematically, in a cutout section 12' of this track 12. In a practical arrangement, a plurality of rows can naturally also be arranged beside and/or above one another. Such workpiece carriers 11 are shown in more detail in FIG. 2.

At a transfer station 13, headlamp reflectors 10 arriving along a transport line 14 are deposited or laid onto the workpiece carriers 11. The transport line 14 brings headlamp reflectors, for example produced in a plastic spray process, to the track 12.

The workpiece carriers 11 provided with headlamp reflectors 10 first enter a vacuum inlet chamber 15, then a pre-glow chamber 16, which in some cases can be omitted, then a metallization chamber 17, then a protective coating chamber 18 from which they are again conveyed out via a vacuum outlet chamber 19. At a transfer station 20, the coated headlamp reflectors 10 are then again transferred to a transport line 21 for further processing or packing.

In the metallization chamber, the reflective metal layer is applied, for example by magnetron sputtering, which is prior art for other layers produced in continuous plants. The sputtering method offers a sufficiently high coating rate for the desired individual case. For main headlamps having a very high reflectivity of over 80%, aluminium is sputtered on as metal layer and has to be additionally protected against corrosion. In the case of lamps or elements having lower reflectivity requirements (e.g. 60–70%), the magnetron sputtering method additionally provides the opportunity of using corrosion-resistant stainless steel or the like for metallization.

The protective layer in the protective coating chamber 18 is produced by the ECR process described in DE-A 40 03 904. Microwave energy is here injected in a known manner through a window, which is not shown, into the protective coating chamber 18, and by means of a microwave antenna (likewise not shown) adjoining the window is fed into the interior of the receptacle. The pressure of the polymerizable monomer introduced into the protective coating chamber 18 is here set so that according to the Paschen law plasma ignition does not yet occur. Only "latent" microwave energy is present in the interior of the process chamber.

In a known manner, the magnets or permanent magnets additionally required for meeting the resonance condition in the ECR method are then used. The arrangement of the magnets is shown in FIG. 2 and will be described in more detail below. Owing to the pressure conditions, the plasma burns only in the vicinity of the magnets and a glow polymer protective layer is deposited on the headlamp reflectors 10.

The workpiece carriers leaving the vacuum outlet chamber 19 are, after taking off the coated headlamp reflectors 10, conveyed in a return line to a cleaning station 22 which is designed as an automatic cleaning station. There the heavily coated magnets are freed of interfering flakes, for example by rotating brushes. The cleaned workpiece carriers with the cleaned magnets are then again conveyed to the transfer station 13 where they are again loaded with headlamp reflectors 10.

FIG. 2 shows an example of a magnet arrangement on a workpiece carrier 11. This workpiece carrier 11 has a recess into which a headlamp reflector 10 is set from above. A permanent magnet 24 fixed to a vertical rod 23 here reaches from below through the lamp opening 25 of the headlamp reflector 10 into the interior space thereof. This magnet has to have dimensions such that in the vicinity of its surface it has, at the usual microwave frequency of 2.45 GHz, the magnetic flux density of at least 87.5 mT necessary for producing an ECR plasma. An intense plasma can thereby be produced in the interior of the headlamp reflector 10, which plasma leads to a very uniform coating at a sufficiently high rate. Additional permanent magnets 26 are fixed to the workpiece carrier 11 along the periphery of the reflector. By this means, the plasma discharge can be expanded and thus the deposition rate of the protective layer in edge zones can be individually increased. Such additional permanent magnets 26 are used particularly in the case of reflectors having extended plane faces. In simpler embodiments and smaller reflectors, these additional permanent magnets 26 can be omitted. It is important here that the arrangement of the magnets does not hinder the earlier metallic coating process under a sputtering cathode. This mans that there must be no shadowing of individual zones on the reflector. Attention is also drawn to the fact that the rod 23 is of course fixed to the workpiece carrier 11, which is shown only schematically, in a manner likewise not shown.

The example shown bears, as headlamp reflector 10, a deep formed plastic reflector having a plane face. The permanent magnets 24, 26 used can be CoSm permanent magnets. A suitable polymerizable monomer in the protective coating chamber 18 is hexamethyldisiloxane at a pressure of $0.8–5\times10^{-3}$ mbar.

The apparatus described is of course suitable not only for headlamp reflectors, but any desired objects can be provided with a plasma polymer protective layer by means of this apparatus.

We claim:

1. Apparatus for producing a plasma polymer protective layer on workpieces, having a coating chamber into which a polymerizable monomer can be introduced and in which microwaves produce, in the region of the magnetic field of permanent magnets, a plasma for depositing the polymer protective layer on the workpieces held on workpiece carriers, characterized in that the permanent magnets are arranged on the workpiece carriers, and in that there is provided a transport device which conveys the workpiece carriers through the coating chamber, which transport device possesses a return line, having a cleaning station, for the workpiece carriers outside the coating chamber for returning the workpiece carriers from the exit to the entrance of the coating chamber.

2. Apparatus according to claim 1, characterized in that the transport device has a feed velocity corresponding to the production rhythm for the workpieces.

3. Apparatus according to claim 1, characterized in that the plasma polymer coating chamber is arranged between vacuum inlet and outlet locks.

4. Apparatus according to claim 1, characterized in that the coating chamber is preceded by a metallization chamber.

5. Apparatus according to claim 4, characterized in that the metallization chamber is preceded by a pre-glow chamber.

6. Apparatus according to claim 1, characterized in that the permanent magnets on the workpiece carriers reach into the headlamp reflectors arranged thereon.

7. Apparatus according to claim 6, characterized in that the permanent magnets reach through the lamp openings of the headlamp reflectors into the latter.

8. Apparatus according to claim 7, characterized in that the headlamp reflectors are set into correspondingly configured recesses of the workpiece carriers (11) with the reflector opening facing upwards, with in each case at least one of the permanent magnets reaching from below through the lamp opening into the interior of the headlamp reflector.

9. Apparatus according to claim 1, characterized in that the permanent magnet reaching into the interior of the headlamp reflector is fitted to a holding rod.

10. Apparatus according to claim 1, characterized in that further permanent magnets are arranged on the periphery of the headlamp reflector.

11. Apparatus according to claim 1, characterized in that the cleaning station, at least for cleaning the permanent magnets, has rotating brushes and/or an air cleaning device.

* * * * *